US012700342B2

(12) United States Patent
Yuan et al.

(10) Patent No.: US 12,700,342 B2
(45) Date of Patent: Aug. 4, 2026

(54) DISPLAY DEVICE AND DISPLAY PANEL

(71) Applicants: Hefei BOE Joint Technology Co., Ltd., Hefei (CN); BOE Technology Group Co., Ltd., Beijing (CN)

(72) Inventors: Zhidong Yuan, Beijing (CN); Yongqian Li, Beijing (CN); Liu Wu, Beijing (CN); Huihui Li, Beijing (CN); Can Yuan, Beijing (CN); Cheng Xu, Beijing (CN)

(73) Assignees: Hefei BOE Joint Technology Co., Ltd., Hefei (CN); BOE Technology Group Co., Ltd., Beijing (CN)

( * ) Notice: Subject to any disclaimer, the term of this patent is extended or adjusted under 35 U.S.C. 154(b) by 137 days.

(21) Appl. No.: 18/687,618

(22) PCT Filed: Mar. 22, 2023

(86) PCT No.: PCT/CN2023/083170
§ 371 (c)(1),
(2) Date: Feb. 28, 2024

(87) PCT Pub. No.: WO2024/192732
PCT Pub. Date: Sep. 26, 2024

(65) Prior Publication Data
US 2025/0246120 A1 Jul. 31, 2025

(51) Int. Cl.
*G09G 3/32* (2016.01)
*G11C 19/28* (2006.01)

(52) U.S. Cl.
CPC ............. *G09G 3/32* (2013.01); *G11C 19/287* (2013.01); *G09G 2300/0426* (2013.01);
(Continued)

(58) Field of Classification Search
CPC ............. G09G 3/32; G09G 2300/0426; G09G 2300/0819; G09G 2300/0842;
(Continued)

(56) References Cited

U.S. PATENT DOCUMENTS

2021/0065630 A1* 3/2021 Feng ...................... G11C 19/28

FOREIGN PATENT DOCUMENTS

| CN | 102630118 A | 8/2012 |
| CN | 102883033 B | 1/2016 |

(Continued)

OTHER PUBLICATIONS

PCT/CN2023/083170 international search report dated Aug. 10, 2023.
PCT/CN2023/083170 Written Opinion dated Aug. 10, 2023.

*Primary Examiner* — Michael A Faragalla
(74) *Attorney, Agent, or Firm* — IPro, PLLC

(57) ABSTRACT

The present disclosure provides a display device and a display panel. The display panel includes: multiple pixel circuit rows at a side of the substrate, where multiple pixel circuit rows form multiple pixel circuit groups distributed in a column direction, and each pixel circuit group includes at least one pixel circuit row; a gate drive circuit, including multiple shift registers, where at least one shift register is between two adjacent pixel circuit groups. Each of the shift register includes: an output sub-circuit, connected with a first node and a second node, configured to perform output based on potentials of the first node and the second node; and an input sub-circuit, connected with multiple clock signal lines to control the potentials of the first node and the second node based on potentials of multiple clock signal lines.

18 Claims, 9 Drawing Sheets

(52) U.S. Cl.
CPC .............. *G09G 2300/0819* (2013.01); *G09G 2300/0842* (2013.01); *G09G 2300/0861* (2013.01); *G09G 2310/0267* (2013.01); *G09G 2310/0286* (2013.01); *G09G 2310/08* (2013.01)

(58) Field of Classification Search
CPC ... G09G 2300/0861; G09G 2310/0267; G09G 2310/0286; G09G 2310/08; G11C 19/287
See application file for complete search history.

(56) References Cited

FOREIGN PATENT DOCUMENTS

| | | | |
|---|---|---|---|
| CN | 113223420 | A | 8/2021 |
| CN | 113851174 | A | 12/2021 |
| CN | 114333706 | A | 4/2022 |
| CN | 114974101 | A | 8/2022 |

* cited by examiner

DISPLAY DEVICE AND DISPLAY PANEL

CROSS-REFERENCE TO RELATED APPLICATIONS

This application is a national stage of international PCT Application No. PCT/CN2023/083170 filed on Feb. 22, 2023, the entire contents of which are incorporated herein by reference.

TECHNICAL FIELD

The present disclosure relates to the field of display technologies and in particular to a display device and a display panel.

BACKGROUND

Along with the development of the society, the display panels draw more and more attention of the people. However, the relating display panels have a wide bezel.

SUMMARY

The object of the present disclosure is to provide a display device and a display panel so as to narrow bezels.

According to an aspect of the present disclosure, there is provided a display panel, including a display region. The display panel includes:

a substrate;

multiple pixel circuit rows, at a side of the substrate, where the multiple pixel circuit rows form multiple pixel circuit groups distributed in a column direction, each of the pixel circuit groups includes at least one pixel circuit row, and each of the at least one pixel circuit row includes pixel circuits;

a gate drive circuit, connected with the pixel circuits and including shift registers, where at least one shift register of the shift registers is between two adjacent pixel circuit groups, and at least a part of the at least one shift register between the two adjacent pixel circuit groups is in the display region;

where each of the shift registers includes:

an output sub-circuit, connected with a first node and a second node, configured to perform output based on potentials of the first node and the second node; and an input sub-circuit, connected with multiple clock signal lines, configured to control the potentials of the first node and the second node based on potentials of the multiple clock signal lines.

Furthermore, the pixel circuits are connected with data lines extending in the column direction, and the clock signal lines extend in the column direction. The display panel further includes clock connection lines. Each of the clock signal lines is connected to the input sub-circuit of each shift register through one of the clock connection lines. An orthographic projection of the clock connection lines onto the substrate is spaced apart from an orthographic projection of the data lines onto the substrate. The orthographic projection of the clock connection lines onto the substrate is not overlapped with the orthographic projection of the data lines onto the substrate.

Furthermore, the input sub-circuit is connected with two clock signal lines, the input sub-circuit includes a cascade sub-circuit, a first control sub-circuit and a second control sub-circuit, one clock signal line of the two clock signal lines is connected with the cascade sub-circuit and the second control sub-circuit, and the other clock signal line of the two clock signal lines is connected with the first control sub-circuit;

where the cascade sub-circuit is connected with a cascade signal input end and the first node to control the cascade signal input end to be connected with the first node under control of a potential of the clock signal line;

where the first control sub-circuit is connected with the cascade signal input end and a control node to control a potential of the control node based on potentials of the cascade signal input end and the other clock signal line; and where the second control sub-circuit is connected with the control node and the second node to control a potential of the second node based on potentials of the clock signal line and the control node.

Furthermore, the cascade sub-circuit includes a cascade transistor, a first electrode of the cascade transistor is connected with the cascade signal input end, a second electrode of the cascade transistor is connected with the first node, and a control electrode of the cascade transistor is connected with the clock signal line; or, where the cascade sub-circuit includes two cascade transistors, the two cascade transistors are serially connected between the cascade signal input end and the first node, and control electrodes of the two cascade transistors are connected with the clock signal line.

Furthermore, the first control sub-circuit includes a first control transistor and a second control transistor, a first electrode of the first control transistor is connected with a first power source end, a second electrode of the first control transistor is connected with the control node, and a control electrode of the first control transistor is connected with the other clock signal line; and where the second control transistor includes one second control transistor, a first electrode of the second control transistor is connected with the other clock signal line, a second electrode of the second control transistor is connected with the control node, and a control electrode of the second control transistor is connected with the cascade signal input end; or, the second control transistor includes two second control transistors, the two second control transistors are serially connected between the other clock signal line and the control node, and the control electrodes of the two second control transistors are connected to the cascade signal input end.

Furthermore, the cascade sub-circuit includes two cascade transistors, and the second control transistor includes two second control transistors, and each of the shift registers includes an anti-leakage sub-circuit; where the anti-leakage sub-circuit includes:

a first anti-leakage transistor, where a first electrode of the first anti-leakage transistor is connected between the two serially connected cascade transistors, a second electrode of the first anti-leakage transistor is connected to the first power source end, and a control electrode of the first anti-leakage transistor is connected with the first node; and a second anti-leakage transistor, where a first electrode of the second anti-leakage transistor is connected between the two serially connected second control transistors, a second electrode of the second anti-leakage transistor is connected to the first power source end, and a control electrode of the second anti-leakage transistor is connected with the control node.

Furthermore, the second control sub-circuit includes a third control transistor and a fourth control transistor, a first electrode of the third control transistor is connected with the clock signal line, a control electrode of the third control transistor is connected with the control node, a first electrode of the fourth control transistor is connected with a second electrode of the third control transistor, a control electrode of the fourth control transistor is connected with the clock signal line, and a second electrode of the fourth control transistor is connected with the second node.

Furthermore, each of the shift registers includes a pull-down sub-circuit, and the pull-down sub-circuit is connected with the first node, the second node and a second power source end, and the pull-down sub-circuit is configured to control the second node to be connected with the second power source end under control of the potential of the first node.

Furthermore, the pull-down sub-circuit includes a pull-down transistor, a first electrode of the pull-down transistor is connected with a second power source end, a second electrode of the pull-down transistor is connected with the second node, and a control electrode of the pull-down transistor is connected with the first node.

Furthermore, each of the shift registers includes a reset sub-circuit, and the reset sub-circuit is connected with the first node and a reset signal end, and the reset sub-circuit is configured to reset the first node under the control of a potential of the reset signal end; and/or, the reset sub-circuit is connected with the second node and the reset signal end, and the reset sub-circuit is configured to reset the second node under the control of the potential of the reset signal end.

Furthermore, the reset sub-circuit includes a first reset transistor and a second reset transistor, a first electrode of the first reset transistor is connected with a second power source end, a second electrode of the first reset transistor is connected with the second node, and a control electrode of the first reset transistor is connected with the reset signal end; and where a first electrode of the second reset transistor is connected with the clock signal line, a second electrode of the second reset transistor is connected with the first node, and a control electrode of the second reset transistor is connected with the reset signal end.

Furthermore, the output sub-circuit includes:

a first output transistor, where a first electrode of the first output transistor is connected with a first power source end, a second electrode of the first output transistor is connected with a signal output end, and a control electrode of the first output transistor is connected with the first node; and a second output transistor, where a first electrode of the second output transistor is connected with a second power source end, a second electrode of the second output transistor is connected with the signal output end, and a control electrode of the second output transistor is connected with the second node.

Furthermore, each of the pixel circuit groups includes two pixel circuit rows, and there are two shift registers of the shift registers between any two adjacent pixel circuit groups.

Furthermore, for two adjacent shift registers of the shift registers, the cascade sub-circuits of the two shift registers are connected to different clock signal lines; where the first control sub-circuits of the two shift registers are connected to different clock signal lines; and where the second control sub-circuits of the two shift registers are connected to different clock signal lines.

Furthermore, in a row direction, a space between two adjacent pixel circuit groups includes a first region, a second region, a third region, a fourth region, a fifth region, a sixth region and a seventh region that are sequentially arranged; and where the two shift registers between the two adjacent pixel circuit groups include a first register and a second register, and output sub-circuits of the first register and the second register are in the seventh region; a cascade sub-circuit of the first register is in the first region, and a cascade sub-circuit of the second register is in the second region; where a first control sub-circuit of the first register is in the third region, and a second control sub-circuit of the first register is in the fourth region; where a first control sub-circuit of the second register is in the fifth region, and a second control sub-circuit of the second register is in the sixth region.

Furthermore, the display panel includes:

a gate electrode layer, at a side of the substrate, where the control electrodes of the transistors in the shift registers are composed of a partial pattern of the gate electrode layer;

a source-drain electrode layer, at a side of the gate electrode layer away from the substrate, where the first electrodes and the second electrodes of the transistors in the shift registers are composed of a partial pattern of the source-drain electrode layer;

where a control electrode pattern, a first electrode pattern and a second electrode pattern of the cascade transistor of the first register are respectively same as a control electrode pattern, a first electrode pattern and a second electrode pattern of the cascade transistor of the second register; and/or, a control electrode pattern, a first electrode pattern and a second electrode pattern of the first control transistor of the first register are respectively same as a control electrode pattern, a first electrode pattern and a second electrode pattern of the first control transistor of the second register; and/or, a control electrode pattern, a first electrode pattern and a second electrode pattern of the second control transistor of the first register are respectively same as a control electrode pattern, a first electrode pattern and a second electrode pattern of the second control transistor of the second register; and/or, a control electrode pattern, a first electrode pattern and a second electrode pattern of the third control transistor of the first register are respectively same as a control electrode pattern, a first electrode pattern and a second electrode pattern of the third control transistor of the second register; and/or, a control electrode pattern, a first electrode pattern and a second electrode pattern of the fourth control transistor of the first register are respectively same as a control electrode pattern, a first electrode pattern and a second electrode pattern of the fourth control transistor of the second register.

Furthermore, the display panel includes:

a gate electrode layer at a side of the substrate; and a source-drain electrode layer at a side of the gate electrode layer away from the substrate;

where each of the pixel circuits include transistors, control electrodes of the transistors in the pixel circuits are composed of a partial region of the gate electrode layer, first electrodes and second electrodes of the transistors in the pixel circuits are composed of a partial region of the source-drain electrode layer; where the shift registers include transistors, control electrodes of the transistors in the shift registers are composed of a partial region of the gate electrode layer, and first electrodes and second electrodes of the transistors in the shift register are composed of a partial region of the source-drain electrode layer; and where the clock connection lines are in the same layer as the gate electrode layer, the data lines are in the same layer as the source-drain electrode layer, and the clock signal lines are at a side of the source-drain electrode layer away from the substrate and connected with the clock connection lines through via holes.

According to one aspect of the present disclosure, there is provided a display device, including the above-mentioned display panel.

In the display device and the display panel of the embodiments of the present disclosure, each shift register includes an output sub-circuit and an input sub-circuit, and the output sub-circuit is connected with the first node and the second node, and the output sub-circuit is configured to perform output based on the potentials of the first node and the second node; the input sub-circuit is connected with multiple clock signal lines to control the potentials of the first node and the second node based on the potentials of multiple clock signal lines. At least one shift register is between two adjacent pixel circuit groups and at least a part of the at least one shift register between two adjacent pixel circuit groups is in the display region. In this way, the bezel of the display panel can be narrowed.

Figure 1:
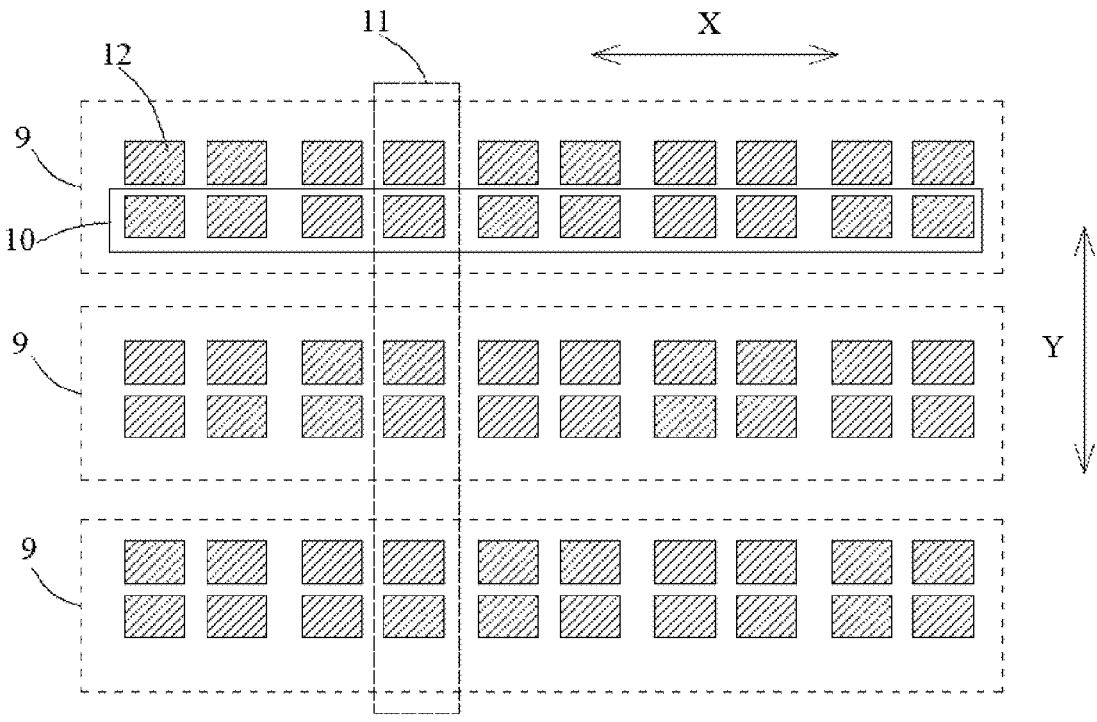
FIG. 1 is a schematic diagram illustrating distribution of pixel circuits according to embodiments of the present disclosure.

Numerals of the drawings are described below: 1, output sub-circuit; 2, cascade sub-circuit; 3, first control sub-circuit; 4, second control sub-circuit; 5, anti-leakage sub-circuit; 6, pull-down sub-circuit; 7, reset sub-circuit; 8, input sub-circuit; 9, pixel circuit group; 10, pixel circuit row; 11, pixel circuit column; 12, pixel circuit; 13, data line; 14, scan line; 15, shift register; 16, substrate; 17, active layer; 18, gate insulation layer; 19, gate electrode layer; 20, first inter-layer insulation layer; 21, source-drain electrode layer; 22, second inter-layer insulation layer; 23, conductive connection layer; 24, planarization layer; 25, pixel definition layer; 26, light-emitting unit; 261, anode; 262, light-emitting material layer; 263, cathode; 27, encapsulation layer; 28, clock connection line; 29, clock signal line; 30, signal connection line; T1, cascade transistor; T2, first control transistor; T3, second control transistor; T4, third control transistor; T5, fourth control transistor; T6, first output transistor; T7, second output transistor; T8, normally-on transistor; T9, first anti-leakage transistor; T10, second anti-leakage transistor; T11, first reset transistor; T12, second reset transistor; T13, pull-down transistor; C1, first storage capacitor; C2, second storage capacitor; C3, third storage capacitor; OUT(n−1), cascade signal input end; CKA, first clock signal end; CKB, second clock signal end; VGH, first power end; VGL, second power end; OUTn, signal output end; TRS, reset signal end; Q, first node; QB, second node; P, control node.

DETAILED DESCRIPTION

Exemplary embodiments will be described in detail herein, with the illustrations thereof represented in the drawings. When the following descriptions involve the drawings, like numerals in different drawings refer to like or similar elements unless otherwise indicated. The embodiments described in the following examples do not represent all embodiments consistent with the present disclosure. Rather, they are merely examples of devices and methods consistent with some aspects of the present disclosure as detailed in the appended claims.

The terms used herein are used to only describe particular embodiments rather than limit the present disclosure. Unless otherwise defined, technical terms or scientific terms used in the present disclosure should have general meanings that can be understood by ordinary persons of skill in the art. The terms "first" "second" and the like used in the specification and claims do not represent any sequence, quantity or importance, but distinguish different components. Similarly, the terms "one" and "a" and the like do not represent quantity limitation but represent at least one. The term "multiple" or "plural" represents two or more. Unless otherwise stated, the term "include" or "comprise" or the like is intended to refer to that an element or object appearing before "include" or "comprise" covers an element or object or its equivalents listed after "include" or "comprise" and does not preclude other elements or objects. The singular forms such as "a," "said," and "the" used in the present disclosure and the appended claims are also intended to include plural forms, unless the context clearly indicates otherwise. It is also to be understood that the term "and/or" as used herein refers to and includes any or all possible combinations of one or more associated listed items.

The transistor used in the present disclosure may be a triode, a film transistor or a field effect transistor or another device with the same characteristics. In the embodiments of the present disclosure, in order to distinguish two electrodes other than a control electrode in a transistor, one electrode is referred to as a first electrode and the other is referred to as a second electrode.

In practical operations, when the transistor is a triode, the control electrode may be a base electrode, the first electrode may be a collector electrode, and the second electrode may be an emitter electrode; or, the control electrode may be a base electrode, the first electrode may be an emitter electrode and the second electrode may be a collector electrode.

In practical operations, when the transistor is a film transistor or field effect transistor, the control electrode may be a gate electrode, the first electrode may be a drain electrode and the second electrode may be a source electrode; or, the control electrode may be a gate electrode, the first electrode may be a source electrode and the second electrode may be a drain electrode.

Figure 4:
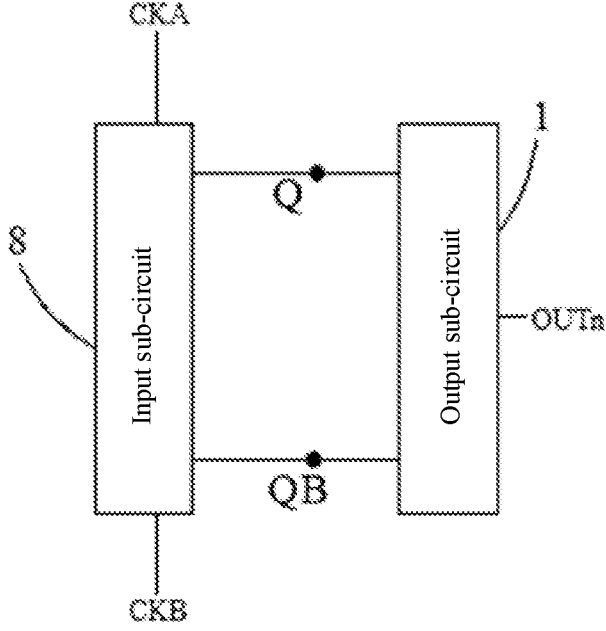
FIGS. 4 to 9 are schematic diagrams illustrating a shift register according to embodiments of the present disclosure.
Figure 11:
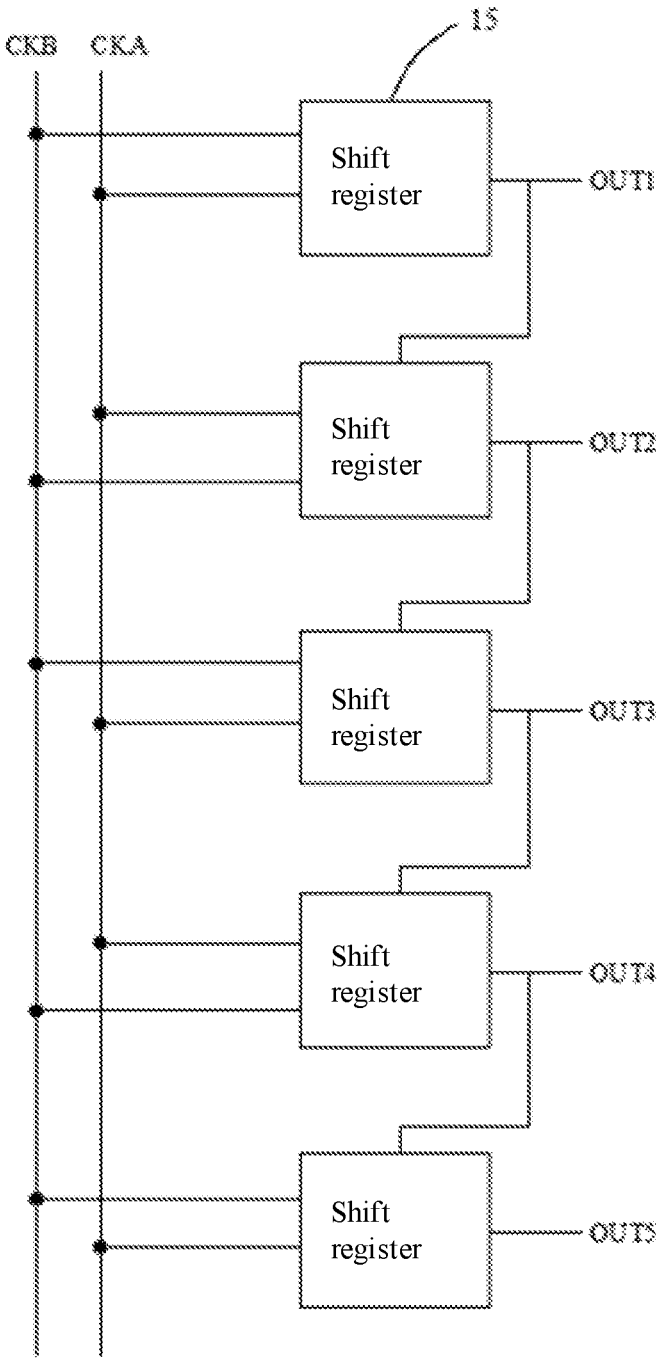
FIG. 11 is a schematic diagram illustrating a gate drive circuit according to embodiments of the present disclosure.

An embodiment of the present disclosure provides a display panel. The display panel may include a display region. Further, the display panel may include a surrounding region which surrounds the display region. As shown in FIG. 1, FIG. 4 and FIG. 11, the display panel includes a substrate, multiple pixel circuit rows 10 and a gate drive circuit.

The multiple pixel circuit rows 10 are at a side of the substrate and in the display region. The multiple pixel circuit rows 10 form multiple pixel circuit groups 9 distributed in a column direction (Y direction shown in FIG. 1). Each of the pixel circuit groups 9 includes at least one pixel circuit row 10. Each of the pixel circuit rows 10 includes multiple pixel circuits 12. The gate drive circuit is connected with the pixel circuits 12 and includes multiple shift registers 15 (see FIG. 11). At least one shift register 15 is between two adjacent pixel circuit groups 9, and at least a part of the at least one shift register 15 between two adjacent pixel circuit groups 9 is in the display region. Each of the shift registers 15 includes an output sub-circuit 1 and an input sub-circuit 8. The output sub-circuit 1 is connected with a first node Q and a second node QB, so as to perform output based on potentials of the first node Q and the second node QB. The input sub-circuit 8 is connected with multiple clock signal lines, so as to control the potentials of the first node Q and the second node QB based on the potentials of the multiple clock signal lines.

In the display panel of the embodiments of the present disclosure, each of the shift registers 15 includes the output sub-circuit 1 and the input sub-circuit 8. The output sub-circuit 1 is connected with the first node Q and the second node QB, so as to perform output based on the potentials of the first node Q and the second node QB. The input sub-circuit 8 is connected with multiple clock signal lines, so as to control the potentials of the first node Q and the second node QB based on the potentials of the multiple clock signal lines. At least one shift register 15 is between two adjacent pixel circuit groups 9, and at least a part of the at least one shift register 15 between two adjacent pixel circuit groups 9 is in the display region. With this arrangement, the bezel of the display panel can be narrowed.

Each part of the display panel of the embodiments of the present disclosure will be detailed below.

The substrate is a rigid substrate. The rigid substrate may be a glass substrate or a Polymethyl methacrylate (PMMA) substrate or the like. Of course, the substrate may also be a flexible substrate. The flexible substrate may be a Polyethylene terephthalate (PET) substrate, a Polyethylene naphthalate two formic acid glycol ester (PEN) substrate or a Polyimide (PI) substrate.

As shown in FIG. 1, the display panel of the present disclosure may include multiple pixel circuits 12 and multiple sub-pixels. The multiple pixel circuits 12 are correspondingly connected with multiple sub-pixels. Multiple sub-pixels may include multiple red sub-pixels, multiple green sub-pixels and multiple blue sub-pixels. The multiple pixel circuits 12 may be at a side of the substrate and in the display region. Multiple pixel circuits 12 may form multiple pixel circuit rows 10, and one pixel circuit row 10 includes multiple pixel circuits 12 distributed in a row direction (X direction shown in FIG. 1). Multiple pixel circuit rows 10 are distributed in a column direction (Y direction shown in FIG. 1). Multiple pixel circuit rows 10 form multiple pixel circuit groups 9 distributed in the column direction. Each of the pixel circuit groups 9 may include at least one pixel circuit row 10, for example, two pixel circuit rows 10 or the like. Taking each of the pixel circuit groups 9 including multiple pixel circuit rows 10 as an example, a distance between adjacent pixel circuit groups 9 may be greater than a distance between adjacent pixel circuit rows 10 in one pixel circuit group 9. Furthermore, multiple pixel circuits 12 may also form multiple pixel circuit columns 11. One pixel circuit column 11 may include multiple pixel circuits 12 distributed in the column direction. Multiple pixel circuit columns 11 are distributed in the row direction.

Figure 2:
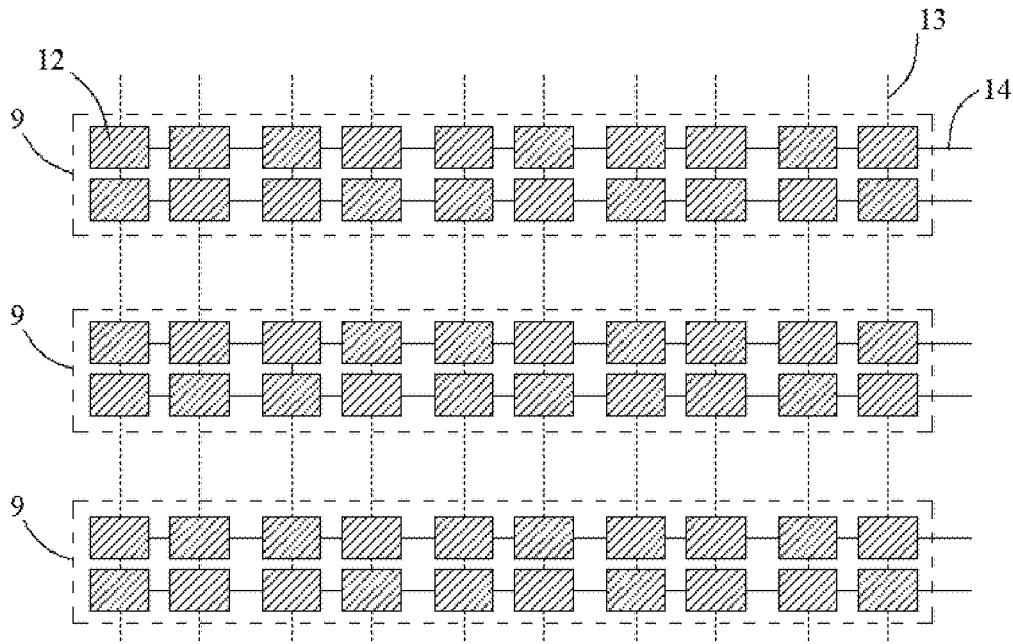
FIG. 2 is a schematic diagram illustrating pixel circuits, data lines and scan lines according to embodiments of the present disclosure.

As shown in FIG. 2, the display panel of the present disclosure may include data lines 13. The data lines 13 may extend in the column direction. The above pixel circuits 12 are connected with the data lines 13 to receive data signals from the data lines 13. Multiple pixel circuits 12 in one pixel circuit column 11 may be connected on a same data line 13. Furthermore, there may be multiple data lines 13 which are in one-to-one connection with multiple pixel circuit columns 11.

As shown in FIG. 2, the display panel of the present disclosure may include scan lines 14. The scan lines 14 may extend in the row direction. The above pixel circuits 12 are connected with the scan lines 14 to receive scan signals from the scan lines 14. Multiple pixel circuits 12 in one pixel circuit row 10 may be connected on a same scan line 14. Furthermore, there may be multiple scan lines 14 which are in one-to-one connection with multiple pixel circuit rows 10.

Figure 3:
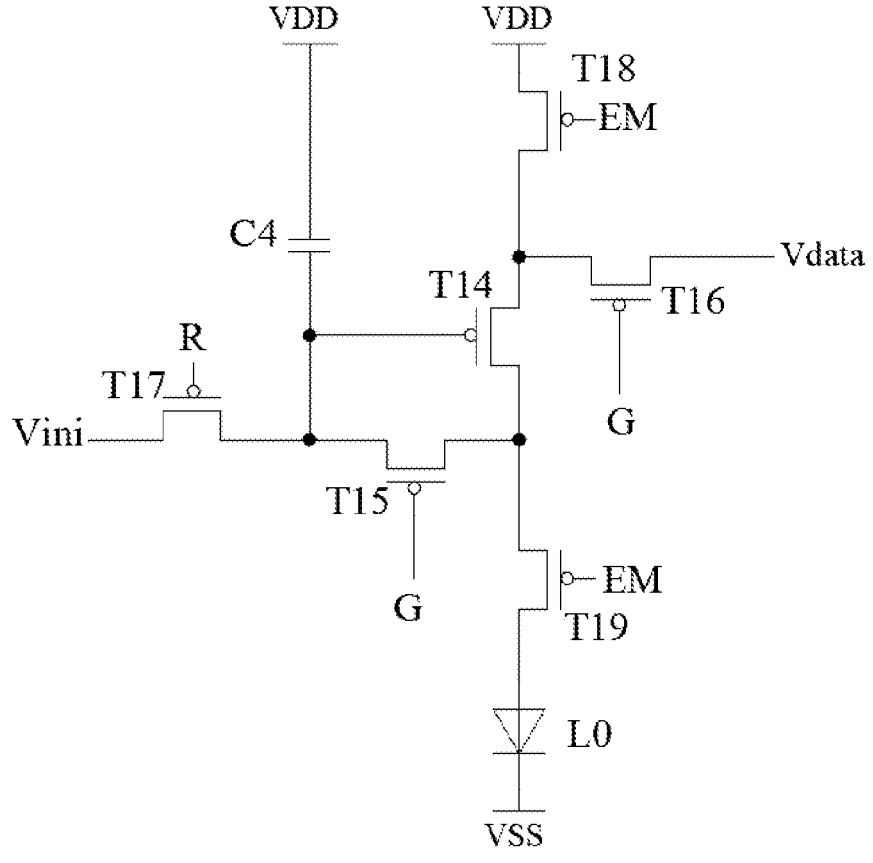
FIG. 3 is a schematic diagram illustrating pixel circuits according to embodiments of the present disclosure.

As shown in FIG. 3, each of the above pixel circuits 12 may include a third reset transistor T17, a drive transistor T14, a data write transistor T16, a compensation transistor T15, a first light emission control transistor T18, a second light emission control transistor T19, and an energy storage capacitor C4. A first electrode of the third reset transistor T17 is connected with an initialization signal end Vini, a second electrode of the third reset transistor T17 is connected with a control electrode of the drive transistor T14, and a control electrode of the third reset transistor T17 is connected with a pixel reset end R. The energy storage capacitor C4 is connected between the control electrode of the drive transistor T14 and a third power source end VDD. A first electrode of the first light emission control transistor T18 is connected with the third power source end VDD, and a control electrode of the first light emission control transistor T18 is connected with a light emission control signal end EM. A first electrode of the data write transistor T16 is connected with a data signal end Vdata, and a control electrode of the data write transistor T16 is connected with a scan signal end G. A first electrode of the drive transistor T14 is respectively connected with a second electrode of the first light emission control transistor T18 and a second electrode of the data write transistor T16. A first electrode of the compensation transistor T15 is connected with a second electrode of the drive transistor T14, a second electrode of the compensation transistor T15 is connected with the control electrode of the drive transistor T14, and a control electrode of the compensation transistor T15 is connected with the scan signal end G. A first electrode of the second light emission control transistor T19 is connected with the second electrode of the drive transistor T14, a second electrode of the second light emission control transistor T19 is connected with a first electrode of a light emitting element L0, and a second electrode of the light emitting element L0 is connected with a fourth power source end VSS. The first electrode of the data write transistor T16 may be connected with the above data line 13. In an embodiment, the above scan lines 14 may be connected with the control electrodes of the first light emission control transistor T18 and the second light emission control transistor T19. In another embodiment, the above scan lines 14 may be connected with the control electrodes of the data write transistor T16 and the compensation transistor T15.

The gate drive circuit is connected with the pixel circuits 12. The gate drive circuit may be connected with the above scan lines 14, such that the gate drive electrode is connected with the pixel circuits 12 via the scan lines 14. As shown in FIG. 11, the gate drive circuit includes multiple shift registers 15. At least one shift register 15 is between two adjacent pixel circuit groups 9, and at least a part of the at least one shift register 15 between two adjacent pixel circuit groups 9 is in the display region. For example, there are two shift registers of the shift registers 15 between any two adjacent pixel circuit groups 9, and the two shift registers 15 between two adjacent pixel circuit groups 9 are in the display region.

Figure 5:
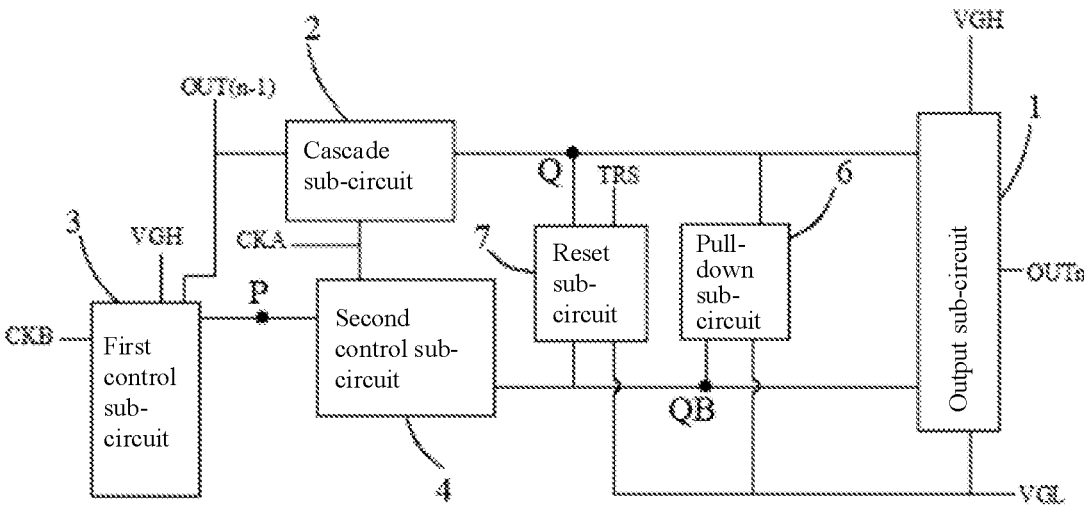
Figure 6:
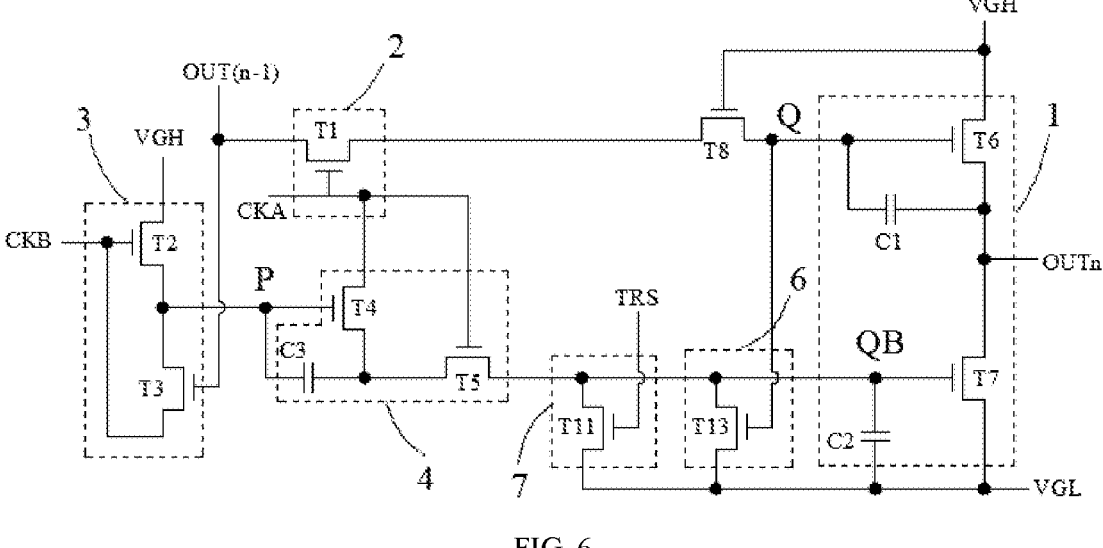
Figure 8:
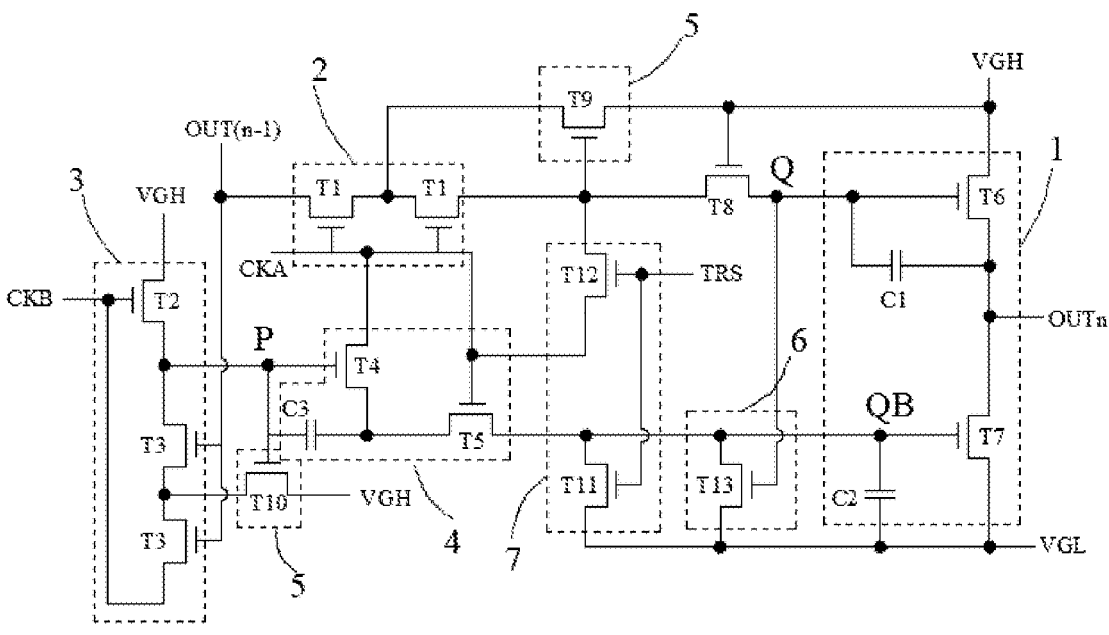

As shown in FIG. 4 and FIG. 5, each of the above shift registers 15 may include an output sub-circuit 1 and an input sub-circuit 8. The output sub-circuit 1 is connected with a first node Q and a second node QB, so as to perform output based on potentials of the first node Q and the second node QB. For example, as shown in FIG. 6 and FIG. 8, the output sub-circuit 1 may include a first output transistor T6 and a second output transistor T7. A first electrode of the first output transistor T6 is connected with a first power source end VGH, a second electrode of the first output transistor T6 is connected with a signal output end OUTn, and a control electrode of the first output transistor T6 is connected with the first node Q. The first power source end VGH can output a constant high-voltage signal. The signal output end OUTn may be connected with the above scan line 14. A first electrode of the second output transistor T7 is connected with a second power source end VGL, a second electrode of the second output transistor T7 is connected with the signal output end OUTn, and a control electrode of the second output transistor T7 is connected with the second node QB. The second power source end VGL can output a constant low-voltage signal. The shift registers may further include a normally-on transistor T8. Furthermore, the output sub-circuit 1 may further include a first storage capacitor C1 and a second storage capacitor C2. The first storage capacitor C1 is connected between the signal output end OUTn and the control electrode of the first output transistor T6. The second storage capacitor C2 is connected between the second power source end VGL and the control electrode of the second output transistor T7.

Figure 14:
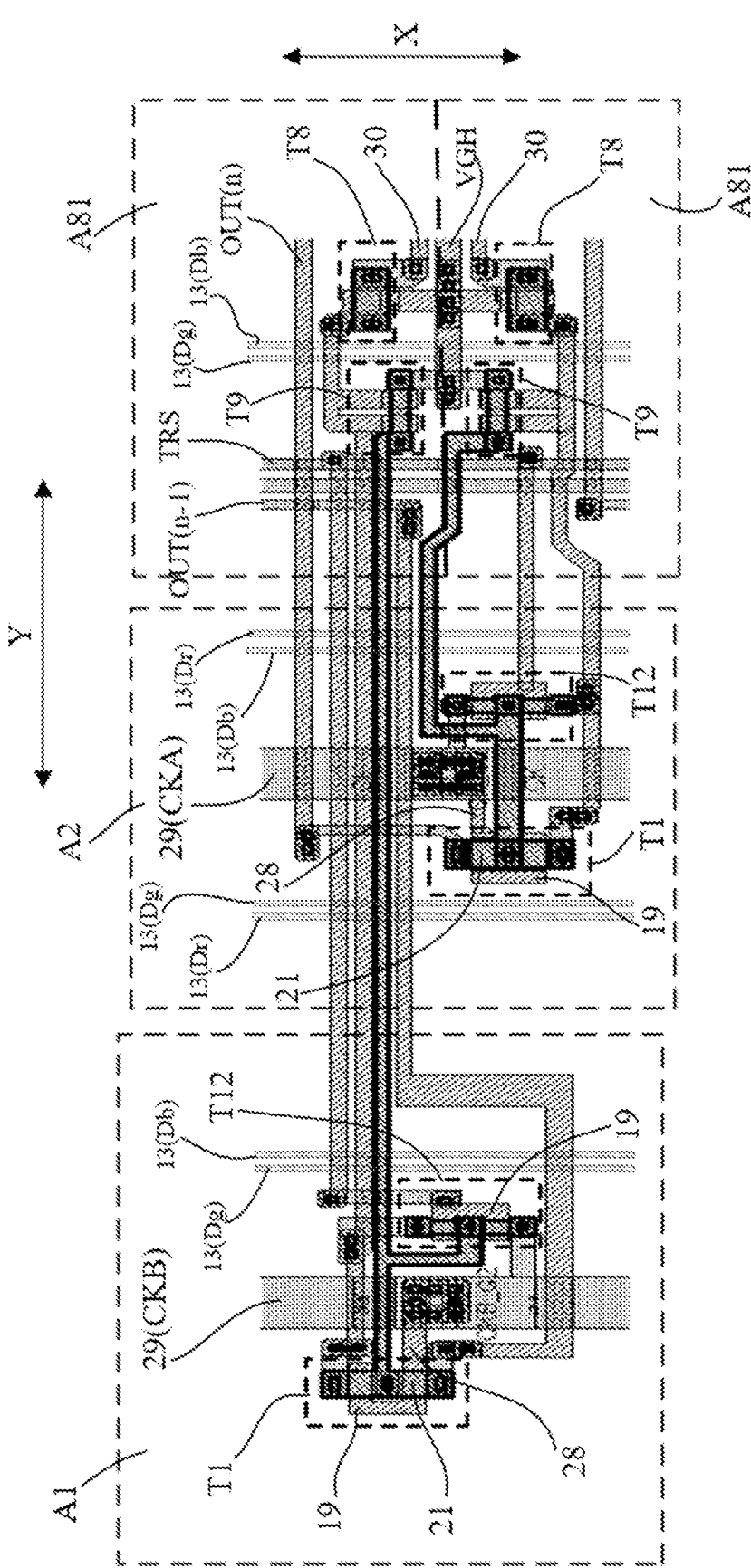
FIG. 14 is a schematic diagram illustrating parts of a shift register in a first region, a second region and an eighth region shown in FIG. 12 according to embodiments of the present disclosure.
Figure 15:
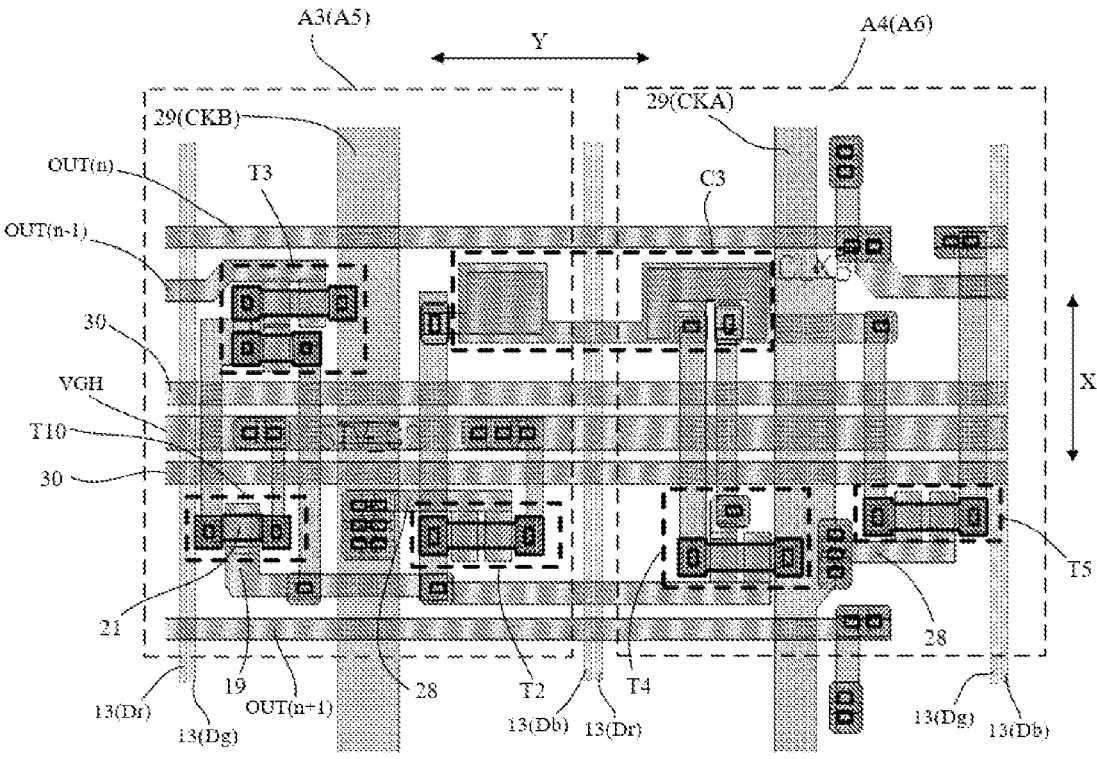
FIG. 15 is a schematic diagram illustrating parts of a shift register in a third region and a fourth region shown in FIG. 12 according to embodiments of the present disclosure.

As shown in FIG. 4, the input sub-circuit 8 is connected with multiple clock signal lines 29 (see FIG. 14 and FIG. 15) to control the potentials of the first node Q and the second node QB based on potentials of the multiple clock signal lines 29. The clock signal lines 29 may extend in the column direction. The display panel may include multiple clock connection lines 28 (see FIG. 14 and FIG. 15). As shown in FIG. 14 and FIG. 15, each of the clock signal lines 29 may be connected to the input sub-circuit 8 of each shift register via one of the clock connection lines 28. An orthographic projection of the clock connection lines 28 onto the substrate is spaced apart from an orthographic projection of the data lines 13 onto the substrate, that is, the orthographic projection of the clock connection lines 28 onto the substrate is not overlapped with the orthographic projection of the data lines 13 onto the substrate. In this case, the influence of the signals transmitted by the clock connection lines 28 on the signals transmitted by the data lines 13 can be reduced. The extension direction of the clock connection lines 28 may intersect with the column direction. For example, the clock connection lines 28 may extend in the row direction. Furthermore, the data lines 13 may include a first data line Dr, a second data line Dg and a third data line Db. The pixel circuits 12 connected with the red sub-pixels are connected with the first data lines Dr, the pixel circuits 12 connected with the green sub-pixels are connected with the second data lines Dg, and the pixel circuits 12 connected with the blue sub-pixels are connected with the third data lines Db.

Figure 7:
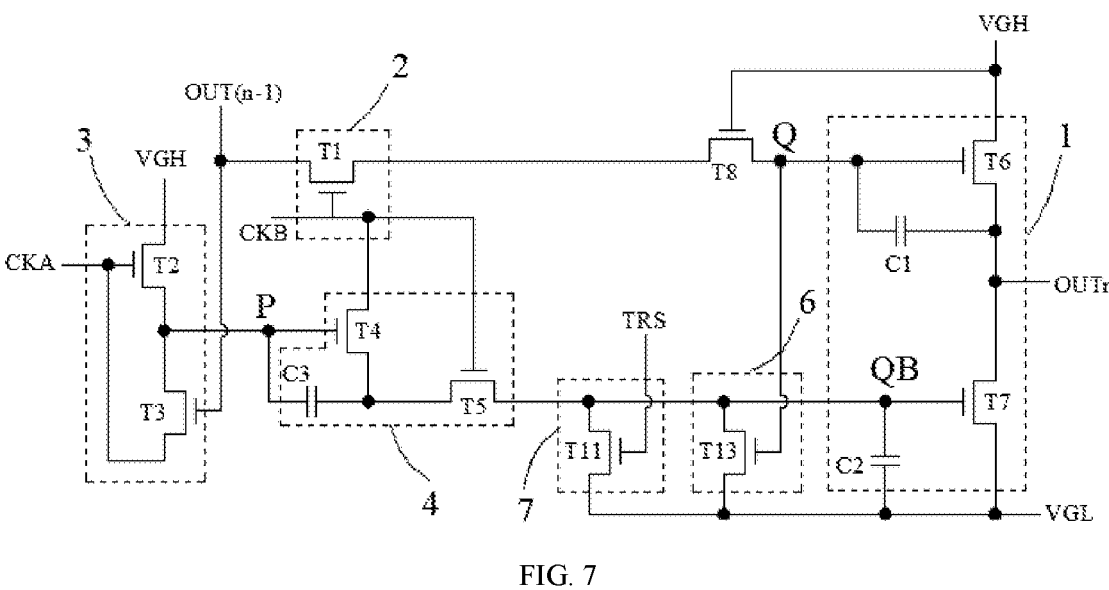

Taking the number of clock signal lines 29 being two as an example, as shown in FIG. 6 and FIG. 7, the input sub-circuit 8 may include a cascade sub-circuit 2, a first control sub-circuit 3 and a second control sub-circuit 4. One of the two clock signal lines 29 may be connected to the cascade sub-circuit 2 and the second control sub-circuit 4, and the other clock signal line 29 may be connected with the first control sub-circuit 3. Each of the shift registers 15 may include a first clock signal end CKA and a second clock signal end CKB, and the first clock signal end CKA and the second clock signal end CKB are in one-to-one connection with the two clock signal lines 29.

Figure 9:
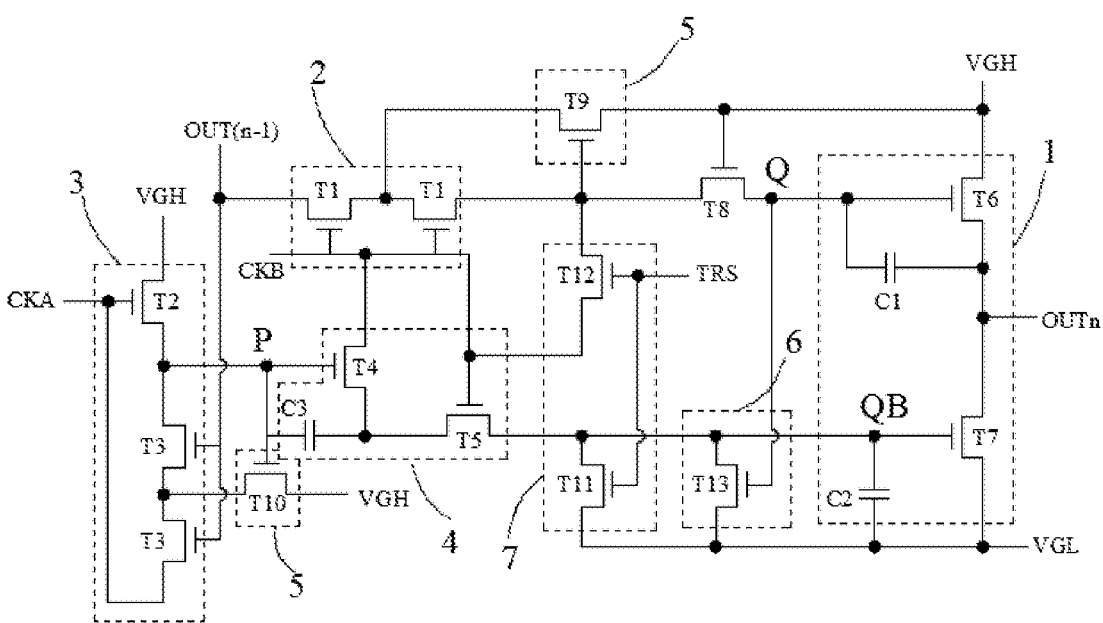

The cascade sub-circuit 2 may also be connected with a cascade signal input end OUT(n−1) and the first node Q to control the cascade signal input end OUT(n−1) to be connected (electrically/functionally connected) with the first node Q under the control of the potential of the clock signal line 29. In an embodiment, as shown in FIG. 6 and FIG. 7, the cascade sub-circuit 2 may include a cascade transistor T1. A first electrode of the cascade transistor T1 is connected with the cascade signal input end OUT(n−1), a second electrode of the cascade transistor T1 is connected with the first node Q, and a control electrode of the cascade transistor T1 is connected with the clock signal line 29. In another embodiment, as shown in FIG. 8 and FIG. 9, the cascade sub-circuit 2 may include two cascade transistors T1 which are serially connected between the cascade signal input end OUT(n−1) and the first node Q. The control electrodes of the two cascade transistors T1 are connected with the clock signal lines 29. Specifically, as shown in FIG. 14, the control electrodes of the cascade transistors T1 are connected with the clock signal lines 29 via the clock connection lines 28. Furthermore, each of the shift registers may further include a normally-on transistor T8. A first electrode of the normally-on transistors T8 is connected to the second electrode of the cascade transistors T1, a second electrode of the normally-on transistors T8 is connected to the first node Q, and a control electrode of the normally-on transistors T8 is connected to the first power source end VGH.

The first control sub-circuit 3 is further connected with the cascade signal input end OUT(n−1) and a control node P to control a potential of the control node P based on the potentials of the cascade signal input end OUT(n−1) and the clock signal line 29. As shown in FIG. 6 and FIG. 7, the first control sub-circuit 3 includes a first control transistor T2 and a second control transistor T3. A first electrode of the first control transistor T2 is connected to the first power source end VGH, a second electrode of the first control transistor T2 is connected to the control node P, and a control electrode of the first control transistor T2 is connected to the other clock signal line 29. Specifically, as shown in FIG. 15, the control electrode of the first control transistor T2 is connected with the other clock signal line 29 via the clock connection line 28. The number of second control transistor T3 is one. A first electrode of the second control transistor T3 is connected to the clock signal line 29, a second electrode of the second control transistor T3 is connected to the control node P, and a control electrode of the second control transistor T3 is connected to the cascade signal input end OUT(n−1). As shown in FIG. 15, the first electrode of the second control transistor T3 may be connected with the clock signal line 29 through a via hole. In other embodiments of the present disclosure, as shown in FIG. 8 and FIG. 9, The number of second control transistors T3 can be two, and the two second control transistors T3 are serially connected between the clock signal line 29 and the control node P; the control electrodes of the two second control transistors T3 are connected to the cascade signal input end OUT(n−1).

As shown in FIG. 8 and FIG. 9, the above cascade sub-circuit 2 includes two cascade transistors T1. Taking the number of second control transistors T3 being two as an example, each of the shift registers 15 may further include an anti-leakage sub-circuit 5. The anti-leakage sub-circuit 5 may include a first anti-leakage transistor T9 and a second anti-leakage transistor T10. A first electrode of the first anti-leakage transistor T9 is connected between two serially connected cascade transistors T1, a second electrode of the first anti-leakage transistor T9 is connected to the first power source end VGH, and a control electrode of the first anti-leakage transistor T9 is connected to the first node Q. A first electrode of the second anti-leakage transistor T10 is connected between two serially connected second control transistors T3, a second electrode of the second anti-leakage transistor T10 is connected to the first power source end VGH, and a control electrode of the second anti-leakage transistor T10 is connected to the control node P.

The second control sub-circuit 4 is further connected to the control node P and the second node QB to control the potential of the second node QB based on the potentials of the clock signal line 29 and the control node P. The second control sub-circuit 4 may include a third control transistor T4 and a fourth control transistor T5. A first electrode of the third control transistor T4 is connected to the clock signal line 29, a control electrode of the third control transistor T4 is connected to the control node P, a first electrode of the fourth control transistor T5 is connected to a second electrode of the third control transistor T4, a control electrode of the fourth control transistor T5 is connected to the clock signal line 29, and a second electrode of the fourth control transistor T5 is connected to the second node QB. The second control sub-circuit 4 may further include a third storage capacitor C3. The third storage capacitor C3 is connected between the control node P and the second electrode of the third control transistor T4. As shown in FIG. 15, the first electrode of the third control transistor T4 may be connected with the clock signal line 29 through a via hole, and the control electrode of the fourth control transistor T5 may be connected to the clock signal line 29 via the clock connection line 28.

As shown in FIG. 6 to FIG. 9, each of the shift registers 15 may further include a pull-down sub-circuit 6. The pull-down sub-circuit 6 is connected with the first node Q, the second node QB and the second power source end VGL, so as to control the second node QB to be connected with the second power source end VGL under the control of the potential of the first node Q. For example, the pull-down sub-circuit 6 may include a pull-down transistor T13. A first electrode of the pull-down transistor T13 is connected with the second power source end VGL, a second electrode of the pull-down transistor T13 is connected with the second node QB, and a control electrode of the pull-down transistor T13 is connected with the first node Q.

As shown in FIG. 6 to FIG. 9, each of the shift registers 15 may further include a reset sub-circuit 7. The reset sub-circuit 7 is connected with the first node Q and a reset signal end TRS, and the reset sub-circuit 7 is configured to reset the first node Q under the control of a potential of the reset signal end TRS. The reset sub-circuit 7 is connected with the second node QB and the reset signal end TRS, and the reset sub-circuit 7 is configured to reset the second node QB under the control of the potential of the reset signal end TRS. For example, the reset sub-circuit 7 includes a first reset transistor T11 and a second reset transistor T12. A first electrode of the first reset transistor T11 is connected with the second power source end VGL, a second electrode of the first reset transistor T11 is connected with the second node QB, and a control electrode of the first reset transistor T11 is connected with the reset signal end TRS. A first electrode of the second reset transistor T12 is connected with the clock signal line 29, a second electrode of the second reset transistor T12 is connected with the first node Q, and a control electrode of the second reset transistor T12 is connected with the reset signal end TRS.

Furthermore, for two adjacent shift registers 15, the cascade sub-circuits 2 of the two shift registers 15 are connected to different clock signal lines 29; the first control sub-circuits 3 of the two shift registers 15 are connected to different clock signal lines 29; the second control sub-circuits 4 of the two shift registers 15 are connected to different clock signal lines 29. For example, the shift register 15 shown in FIG. 6 and the shift register 15 shown in FIG. 7 are disposed adjacently; for another example, the shift register 15 shown in FIG. 8 and the shift register 15 shown in FIG. 9 are disposed adjacently.

Figure 12:
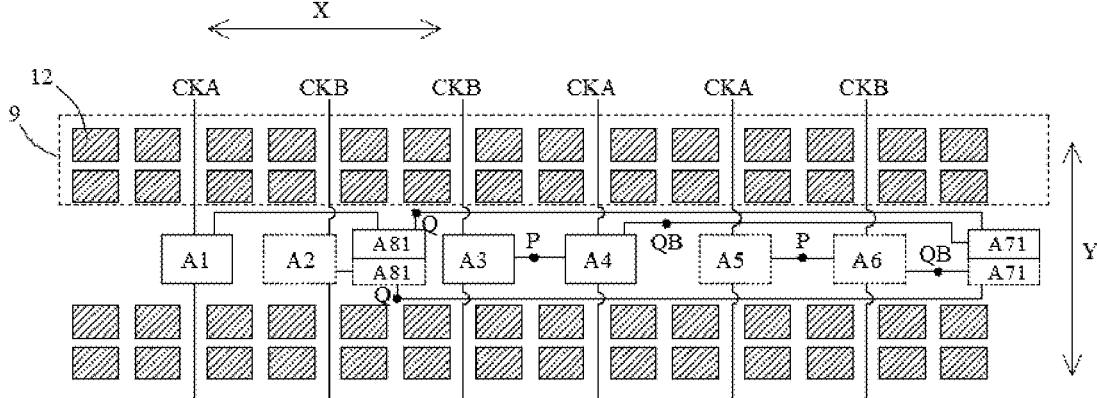
FIG. 12 is a schematic diagram illustrating distribution of a shift register between two adjacent pixel circuit groups according to embodiments of the present disclosure.

As shown in FIG. 12, taking two of the shift registers 15 being between any two adjacent pixel circuit groups 9 as an example, and in the row direction (X direction shown), a space between two adjacent pixel circuit groups 9 includes a first region A1, a second region A2, a third region A3, a fourth region A4, a fifth region A5, a sixth region A6 and a seventh region, which are sequentially arranged. The seventh region may include two seventh sub-regions A71 distributed in the column direction (Y direction shown). Two shift registers 15 between two adjacent pixel circuit groups 9 may include a first register and a second register. In the column direction, the output sub-circuit 1 of the first register is in the seventh sub-region A71 located up in the seventh region, and the output sub-circuit 1 of the second register is in the seventh sub-region A71 located down in the seventh region. The cascade sub-circuit 2 of the first register is in the first region A1, and the cascade sub-circuit 2 of the second register is in the second region A2. The first control sub-circuit 3 of the first register is in the third region A3, and the second control sub-circuit 4 of the first register is in the fourth region A4. The first control sub-circuit 3 of the second register is in the fifth region A5, and the second control sub-circuit 4 of the second register is in the sixth region A6. Furthermore, as shown in FIG. 14, the second reset transistor T12 of the first register may be in the first region A1, and the second reset transistor T12 of the second register may be in the second region A2. As shown in FIG. 15, the second anti-leakage transistor T10 of the first register may be in the third region A3, and the second anti-leakage transistor T10 of the second register may be in the third region A3. It is to be noted that the structure shown in FIG. 15 may be the structure diagram shown in third region A3 and the fourth region A4 or the structure diagram shown in the fifth region A5 and the sixth region A6. A signal connection line 30 in FIG. 15 and the signal connection line in FIG. 14 are a same signal line.

Furthermore, as shown in FIG. 12, an eighth region may be between the second region A2 and the third region A3. The eighth region may include two eighth sub-regions A81 distributed in the column direction. As shown in FIG. 14, in the column direction, the normally-on transistor T8 and the first anti-leakage transistor T9 of the first register may be in the eighth sub-region A81 located up in the eighth region, and the normally-on transistor T8 and the first anti-leakage transistor T9 of the second register may be in the eighth sub-region A81 located down in the eighth region.

Figure 13:
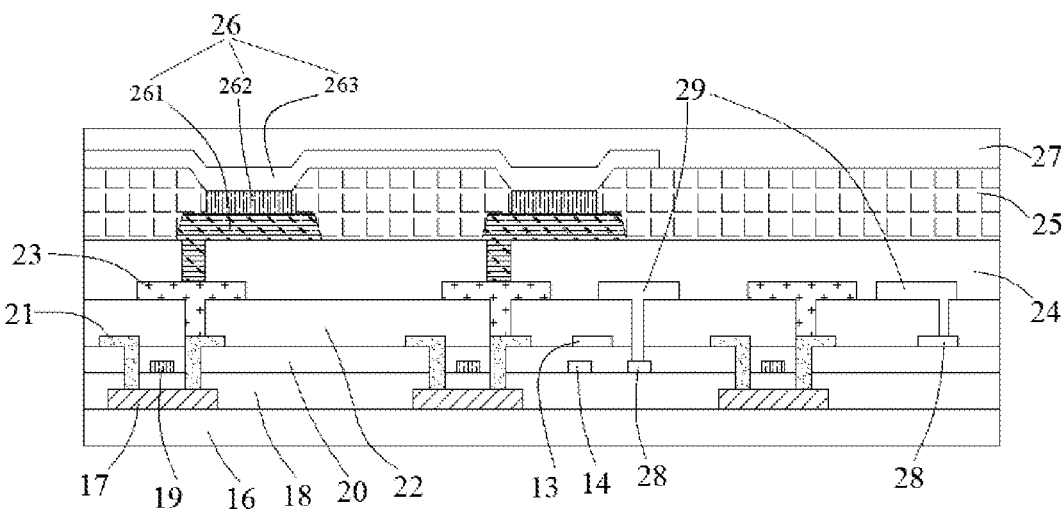
FIG. 13 is a schematic diagram illustrating distribution of film layers of a display panel in a thickness direction according to embodiments of the present disclosure.

As shown in FIG. 13, the display panel may include a gate electrode layer 19 and a source-drain electrode layer 21. The gate electrode layer 19 may be at a side of the substrate 16, and the source-drain electrode layer 21 may be at a side of the gate electrode layer 19 away from the substrate 16. The control electrode of the transistors in the above pixel circuits 12 may be composed of a partial region of the gate electrode layer 19, and the first electrodes and the second electrodes of the transistors in the pixel circuits 12 may be composed of a partial region of the source-drain electrode layer 21. The control electrodes of the transistors in the above shift registers 15 are composed of a partial region of the gate electrode layer 19, and the first electrodes and the second electrodes of the transistors in the shift registers 15 are composed of a partial region of the source-drain electrode layer 21. The display panel may further include an active layer 17, a gate insulation layer 18, a first inter-layer insulation layer 20 and a second inter-layer insulation layer 22. Taking the above transistors being top-gate thin film transistors as an example, the active layer 17 is at a side of the substrate 16, the gate insulation layer 18 covers the active layer 17, and the gate electrode layer 19 is at a side of the gate insulation layer 18 away from the substrate 16. The first inter-layer insulation layer 20 may cover the gate electrode layer 19, and the source-drain electrode layer 21 may be at a side of the first inter-layer insulation layer 20 away from the substrate 16. The second inter-layer insula-tion layer 22 may cover the source-drain electrode layer 21. In other embodiments of the present disclosure, the transis-tors may also be bottom-gate thin film transistors. Further-more, the display panel may further include a conductive connection layer 23, a planarization layer 24, a pixel defi-nition layer 25, a light-emitting unit 26, and an encapsula-tion layer 27. The conductive connection layer 23 may be at a side of the second inter-layer insulation layer 22 away from the substrate 16, and connected with the source-drain electrode layer 21 through via holes. The planarization layer 24 may cover the conductive connection layer 23 and the second inter-layer insulation layer 22. There are multiple light-emitting units 26 distributed in spacing at a side of the planarization layer 24 away from the substrate 16. Multiple light-emitting units 26 are in one-to-one connection with the above multiple pixel circuits 12. The light-emitting units 26 may be connected with the conductive connection layer 23 through via holes to enable the light-emitting units 26 to be connected with the corresponding pixel circuits 12. The pixel definition layer 25 is on the planarization layer 24 and surrounds multiple light-emitting units 26. The encapsula-tion layer 27 may cover multiple light-emitting units 26. Furthermore, each light-emitting unit 26 may include an anode 261, a light-emitting material layer 262 and a cathode 263. The anode 261 may be at a side of the planarization layer 24 away from the substrate 16. The light-emitting material layer 262 may be at a side of the anode 261 away from the substrate 16. The cathode 263 may be at a side of the light-emitting material layer 262 away from the substrate 16. One light-emitting unit 26 may form one of the above sub-pixels.

As shown in FIG. 13, the above scan lines 14 may be in the same layer as the gate electrode layer 19, and the data lines 13 may be in the same layer as the source-drain electrode layer 21. A part of the clock connection lines 28 may be in the same layer as the gate electrode layer 19, and a part of the clock connection lines 28 may be in the same layer as the source-drain electrode layer 21. The clock connection lines 28 connected between the cascade transis-tors T1 and the clock signal lines 29 may be in the same layer as the gate electrode layer 19; the clock connection lines 28 connected between the first control transistors T2 and the clock signal lines 29 may be in the same layer as the gate electrode layer 19; the clock connection lines 28 connected between the third control transistors T4 and the clock signal lines 29 may be in the same layer as the source-drain electrode layer 21; and the clock connection lines 28 connected between the fourth control transistors T5 and the clock signal lines 29 may be in the same layer as the gate electrode layer 19. The above clock signal lines 29 are at a side of the source-drain electrode layer 21 away from the substrate 16, and connected with the clock connection lines 28 through via holes. For example, the clock signal lines 29 are at a side of the second inter-layer insulation layer 22 away from the substrate 16, and in the same layer as the above conductive connection layer 23.

Furthermore, a control electrode pattern, a first electrode pattern and a second electrode pattern of the cascade tran-sistor T1 of the above first register are respectively same as a control electrode pattern, a first electrode pattern and a second electrode pattern of the cascade transistor T1 of the second register. A control electrode pattern, a first electrode pattern and a second electrode pattern of the first control transistor T2 of the above first register are respectively same as a control electrode pattern, a first electrode pattern and a second electrode pattern of the first control transistor T2 of the second register. A control electrode pattern, a first electrode pattern and a second electrode pattern of the second control transistor T3 of the above first register are respectively same as a control electrode pattern, a first electrode pattern and a second electrode pattern of the second control transistor T3 of the second register. A control electrode pattern, a first electrode pattern and a second electrode pattern of the third control transistor T4 of the above first register are respectively same as a control elec-trode pattern, a first electrode pattern and a second electrode pattern of the third control transistor T4 of the second register. A control electrode pattern, a first electrode pattern and a second electrode pattern of the fourth control transistor T5 of the above first register are respectively same as a control electrode pattern, a first electrode pattern and a second electrode pattern of the fourth control transistor T5 of the second register.

Figure 10:
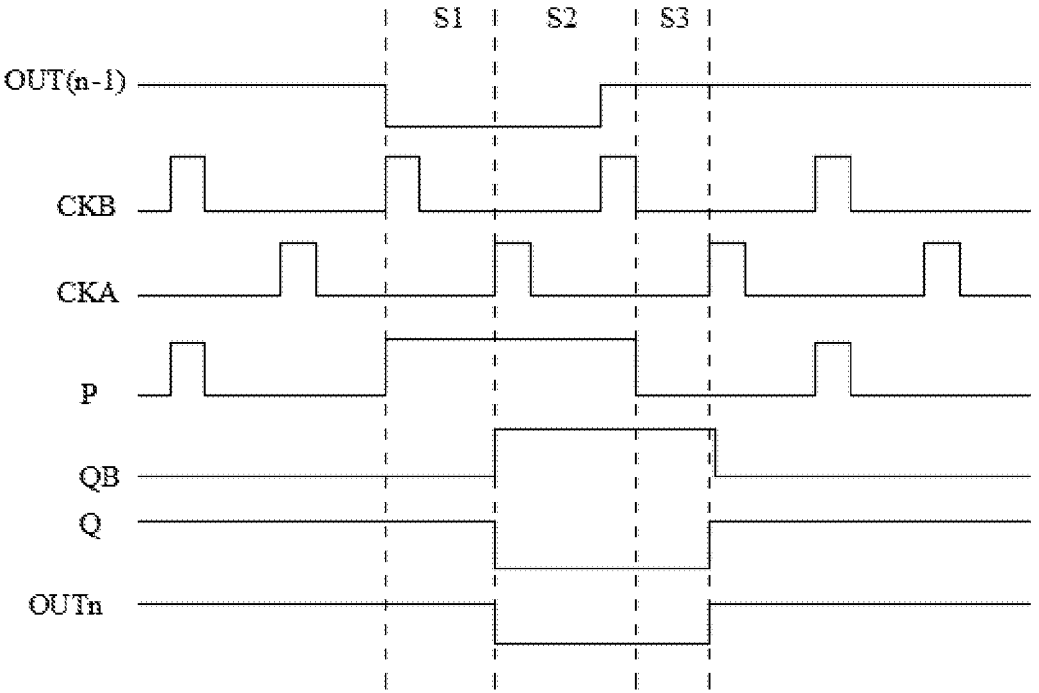
FIG. 10 is a working sequence diagram illustrating a shift register according to embodiments of the present disclosure.

The working process of the shift registers 15 provided by the present disclosure will be described below in combina-tion with the circuit sequence diagram shown in FIG. 10 and the circuit diagram shown in FIG. 6. All transistors in the shift register shown in FIG. 6 are N type transistors.

Before S1 stage, the cascade signal input end OUT(n−1) is at high level, the second control transistor T3 is turned on, and the potential of the control node P changes along with the potential of the second clock signal end CKB; the first node Q is at high level, and the pull-down transistor T13 is turned on; the second node QB is at low level, and the second output transistor T7 is turned off and the first output transistor T6 is turned on; the signal output end OUTn communicates with the first power source end VGH, and the signal output end OUTn outputs high level.

At S1 stage, the cascade signal input end OUT(n−1) is at low level, and the second control transistor T3 is turned off; when the second clock signal end CKB is at high level, the first control transistor T2 is turned on, and the power source end VGH communicates with the control node P; the control node P is at high level, the third control transistor T4 is turned on, and the first node Q is maintained at high level; the second node QB is maintained at low level and the signal output end OUTn outputs high level.

At S2 stage, when the first clock signal end CKA is at high level, the first control transistor T2 is turned on, the first node Q communicates with the cascade signal input end OUT(n−1), the first node Q is changed to low level, and the first output transistor T6 is turned off; the fourth control transistor T5 is turned on, the first clock signal end CKA communicates with the second node QB, the second node QB is changed to high level, the second output transistor T7 is turned on, the second power source end VGL communicates with the signal output end OUTn, and the single output end OUTn outputs low level.

At S3 stage, when the second clock signal end CKB is changed to low level, the cascade signal input end OUT(n−1) is at high level, the first control transistor T2 is turned off, the second control transistor T3 is turned on, the control node P is changed to low level, the first node Q is maintained at low level, the second node QB is maintained at high level, and the signal output end OUTn outputs high level.

After the S3 stage, when the first clock signal end CKA is changed to high level, the cascade transistor T1 is turned on, the first node Q is changed to high level, the pull-down transistor T13 is turned on, the second node QB is at low level, the second output transistor T7 is turned off, the first output transistor T6 is turned on, the signal output end OUTn communicates with the first power source end VGH, and the signal output end OUTn outputs high level.

One or more embodiments of the present disclosure provide a display device, which includes the display panel mentioned in the above embodiments.

The display device and the display panel provided by the embodiments of the present disclosure belong to a same invention idea. Reference may be made to each other for relevant details and beneficial effects and thus no redundant descriptions are made herein.

The above descriptions are merely embodiments of the present disclosure rather than intended to limit the present disclosure in any manner. Although the present disclosure is made with embodiments as above, these preferred embodiments are not used to limit the present disclosure. Those skilled in the art may make some changes or modifications to the technical contents of the present disclosure as equivalent embodiments without departing from the scope of the technical solution of the present disclosure. Any simple changes, equivalent changes or modifications made to the above embodiments based on the technical essence of the present disclosure without departing from the contents of the technical solution of the present disclosure shall all fall within the scope of protection of the present disclosure.

The invention claimed is:

1. A display panel comprising:
a substrate;
multiple pixel circuit rows, at a side of the substrate and in a display region of the display panel, wherein the multiple pixel circuit rows form multiple pixel circuit groups distributed in a column direction, each of the pixel circuit groups comprises at least one pixel circuit row, and each of the at least one pixel circuit row comprises pixel circuits; and
a gate drive circuit, connected with the pixel circuits and comprising shift registers, wherein at least one shift register of the shift registers is between two adjacent pixel circuit groups, and at least a part of the at least one shift register between the two adjacent pixel circuit groups is in the display region;
wherein each of the shift registers comprises:
an output sub-circuit, connected with a first node and a second node, configured to perform output based on potentials of the first node and the second node; and
an input sub-circuit, connected with multiple clock signal lines, configured to control the potentials of the first node and the second node based on potentials of the multiple clock signal lines.

2. The display panel of claim 1, wherein the pixel circuits are connected with data lines extending in the column direction, and the clock signal lines extend in the column direction; wherein the display panel further comprises clock connection lines, each of the clock signal lines is connected to the input sub-circuit of each shift register through one of the clock connection lines, an orthographic projection of the clock connection lines onto the substrate is spaced apart from an orthographic projection of the data lines onto the substrate.

3. The display panel of claim 1, wherein the input sub-circuit is connected with two clock signal lines, the input sub-circuit comprises a cascade sub-circuit, a first control sub-circuit and a second control sub-circuit, one clock signal line of the two clock signal lines is connected with the cascade sub-circuit and the second control sub-circuit, and the other clock signal line of the two clock signal lines is connected with the first control sub-circuit;
wherein the cascade sub-circuit is connected with a cascade signal input end and the first node to control the cascade signal input end to be connected with the first node under control of a potential of the clock signal line;
wherein the first control sub-circuit is connected with the cascade signal input end and a control node to control a potential of the control node based on potentials of the cascade signal input end and the other clock signal line; and
wherein the second control sub-circuit is connected with the control node and the second node to control a potential of the second node based on potentials of the clock signal line and the control node.

4. The display panel of claim 3, wherein the cascade sub-circuit comprises a cascade transistor, a first electrode of the cascade transistor is connected with the cascade signal input end, a second electrode of the cascade transistor is connected with the first node, and a control electrode of the cascade transistor is connected with the clock signal line; or,
wherein the cascade sub-circuit comprises two cascade transistors, the two cascade transistors are serially connected between the cascade signal input end and the first node, and control electrodes of the two cascade transistors are connected with the clock signal line.

5. The display panel of claim 3, wherein the first control sub-circuit comprises a first control transistor and a second control transistor, a first electrode of the first control transistor is connected with a first power source end, a second electrode of the first control transistor is connected with the control node, and a control electrode of the first control transistor is connected with the other clock signal line; and wherein the second control transistor comprises one second control transistor, a first electrode of the second control transistor is connected with the other clock signal line, a second electrode of the second control transistor is connected with the control node, and a control electrode of the second control transistor is connected with the cascade signal input end; or, the second control transistor comprises two second control transistors disposed, the two second control transistors are serially connected between the other clock signal line and the control node, and the control electrodes of the two second control transistors are connected to the cascade signal input end.

6. The display panel of claim 5, wherein the cascade sub-circuit comprises two cascade transistors, the second control transistor comprises two second control transistors, and each of the shift registers comprises an anti-leakage sub-circuit;

wherein the anti-leakage sub-circuit comprises:

a first anti-leakage transistor, wherein a first electrode of the first anti-leakage transistor is connected between the two serially connected cascade transistors, a second electrode of the first anti-leakage transistor is connected to the first power source end, and a control electrode of the first anti-leakage transistor is connected with the first node; and a second anti-leakage transistor, wherein a first electrode of the second anti-leakage transistor is connected between the two serially connected second control transistors, a second electrode of the second anti-leakage transistor is connected to the first power source end, and a control electrode of the second anti-leakage transistor is connected with the control node.

7. The display panel of claim 5, wherein the second control sub-circuit comprises a third control transistor and a fourth control transistor, a first electrode of the third control transistor is connected with the clock signal line, a control electrode of the third control transistor is connected with the control node, a first electrode of the fourth control transistor is connected with a second electrode of the third control transistor, a control electrode of the fourth control transistor is connected with the clock signal line, and a second electrode of the fourth control transistor is connected with the second node.

8. The display panel of claim 3, wherein each of the shift registers comprises a pull-down sub-circuit, and the pull-down sub-circuit is connected with the first node, the second node and a second power source end, and the pull-down sub-circuit is configured to control the second node to be connected with the second power source end under the control of the potential of the first node.

9. The display panel of claim 8, wherein the pull-down sub-circuit comprises a pull-down transistor, a first electrode of the pull-down transistor is connected with the second power source end, a second electrode of the pull-down transistor is connected with the second node, and a control electrode of the pull-down transistor is connected with the first node.

10. The display panel of claim 3, wherein each of the shift registers comprises a reset sub-circuit, and the reset sub-circuit is connected with the first node and a reset signal end, and the reset sub-circuit is configured to reset the first node under control of a potential of the reset signal end; and/or, the reset sub-circuit is connected with the second node and the reset signal end, and the reset sub-circuit is configured to reset the second node under the control of the potential of the reset signal end.

11. The display panel of claim 10, wherein the reset sub-circuit comprises a first reset transistor and a second reset transistor, a first electrode of the first reset transistor is connected with a second power source end, a second electrode of the first reset transistor is connected with the second node, and a control electrode of the first reset transistor is connected with the reset signal end; and wherein a first electrode of the second reset transistor is connected with the clock signal line, a second electrode of the second reset transistor is connected with the first node, and a control electrode of the second reset transistor is connected with the reset signal end.

12. The display panel of claim 1, wherein the output sub-circuit comprises:

a first output transistor, wherein a first electrode of the first output transistor is connected with a first power source end, a second electrode of the first output transistor is connected with a signal output end, and a control electrode of the first output transistor is connected with the first node; and a second output transistor, wherein a first electrode of the second output transistor is connected with a second power source end, a second electrode of the second output transistor is connected with the signal output end, and a control electrode of the second output transistor is connected with the second node.

13. The display panel of claim 3, wherein each of the pixel circuit groups comprises two pixel circuit rows, and there are two shift registers of the shift registers between any two adjacent pixel circuit groups.

14. The display panel of claim 13, wherein for two adjacent shift registers of the shift registers, the cascade sub-circuits of the two shift registers are connected to different clock signal lines; wherein the first control sub-circuits of the two shift registers are connected to different clock signal lines; and wherein the second control sub-circuits of the two shift registers are connected to different clock signal lines.

15. The display panel of claim 14, wherein in a row direction, a space between two adjacent pixel circuit groups comprises a first region, a second region, a third region, a fourth region, a fifth region, a sixth region and a seventh region that are sequentially arranged; and wherein the two shift registers between the two adjacent pixel circuit groups comprise a first register and a second register, and output sub-circuits of the first register and the second register are in the seventh region;

wherein a cascade sub-circuit of the first register is in the first region, and a cascade sub-circuit of the second register is in the second region;

wherein a first control sub-circuit of the first register is in the third region, and a second control sub-circuit of the first register is in the fourth region;

wherein a first control sub-circuit of the second register is in the fifth region, and a second control sub-circuit of the second register is in the sixth region.

16. The display panel of claim 15, comprising:

a gate electrode layer, at a side of the substrate, wherein the control electrodes of the transistors in the shift registers are composed of a partial pattern of the gate electrode layer;

a source-drain electrode layer, at a side of the gate electrode layer away from the substrate, wherein the first electrodes and the second electrodes of the transistors in the shift registers are composed of a partial pattern of the source-drain electrode layer;

wherein a control electrode pattern, a first electrode pattern and a second electrode pattern of the cascade transistor of the first register are respectively same as a control electrode pattern, a first electrode pattern and a second electrode pattern of the cascade transistor of the second register; and/or, a control electrode pattern, a first electrode pattern and a second electrode pattern of the first control transistor of the first register are respectively same as a control electrode pattern, a first electrode pattern and a second electrode pattern of the first control transistor of the second register; and/or, a control electrode pattern, a first electrode pattern and a second electrode pattern of the second control transistor of the first register are respectively same as a control electrode pattern, a first electrode pattern and a second electrode pattern of the second control transistor of the second register; and/or, a control electrode pattern, a first electrode pattern and a second electrode pattern of the third control transistor of the first register are respectively same as a control electrode pattern, a first electrode pattern and a second electrode pattern of the third control transistor of the second register; and/or, a control electrode pattern, a first electrode pattern and a second electrode pattern of the fourth control transistor of the first register are respectively same as a control electrode pattern, a first electrode pattern and a second electrode pattern of the fourth control transistor of the second register.

17. The display panel of claim 2, comprising:

a gate electrode layer at a side of the substrate; and a source-drain electrode layer at a side of the gate electrode layer away from the substrate;

wherein each of the pixel circuits comprises transistors, control electrodes of the transistors in the pixel circuits are composed of a partial region of the gate electrode layer, first electrodes and second electrodes of the transistors in the pixel circuits are composed of a partial region of the source-drain electrode layer; wherein the shift registers comprise transistors, control electrodes of the transistors in the shift registers are composed of a partial region of the gate electrode layer, and first electrodes and second electrodes of the transistors in the shift registers are composed of a partial region of the source-drain electrode layer; and wherein the clock connection lines are in the same layer as the gate electrode layer, the data lines are in the same layer as the source-drain electrode layer, and the clock signal lines are at a side of the source-drain electrode layer away from the substrate and connected with the clock connection lines through via holes.

18. A display device, comprising a display panel, wherein the display panel comprises:

a substrate;

multiple pixel circuit rows, at a side of the substrate and in a display region of the display panel, wherein the multiple pixel circuit rows form multiple pixel circuit groups distributed in a column direction, each of the pixel circuit groups comprises at least one pixel circuit row, and each of the at least one pixel circuit row comprises pixel circuits; and a gate drive circuit, connected with the pixel circuits and comprising shift registers, wherein at least one shift register of the shift registers is between two adjacent pixel circuit groups, and at least a part of the at least one shift register between the two adjacent pixel circuit groups is in the display region;

wherein each of the shift registers comprises:

an output sub-circuit, connected with a first node and a second node, configured to perform output based on potentials of the first node and the second node; and an input sub-circuit, connected with multiple clock signal lines, configured to control the potentials of the first node and the second node based on potentials of the multiple clock signal lines.

\* \* \* \* \*